US012572080B2

(12) United States Patent
Chien et al.

(10) Patent No.: US 12,572,080 B2
(45) Date of Patent: Mar. 10, 2026

(54) LITHOGRAPHY SYSTEM AND METHODS

(71) Applicant: Taiwan Semiconductor Manufacturing Co., Ltd., Hsinchu (TW)

(72) Inventors: Shang-Chieh Chien, Hsinchu (TW); Hung-Wen Cho, Hsinchu (TW); Wei-Shin Cheng, Hsinchu (TW); Ming-Hsun Tsai, Hsinchu (TW); Jyun-Yan Chuang, Hsinchu (TW); Li-Jui Chen, Hsinchu (TW); Heng-Hsin Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 810 days.

(21) Appl. No.: 17/747,939

(22) Filed: May 18, 2022

(65) Prior Publication Data

US 2023/0375940 A1 Nov. 23, 2023

(51) Int. Cl.
*G03F 7/00* (2006.01)

(52) U.S. Cl.
CPC .................................... *G03F 7/702* (2013.01)

(58) Field of Classification Search
CPC .. G03F 7/702; G03F 7/70075; G03F 7/70091; G03F 7/70116; G03F 7/70166; G03F 7/70916
See application file for complete search history.

(56) References Cited

U.S. PATENT DOCUMENTS 8,105,735 B2 * 1/2012 Kinoshita ................. G03F 1/24
430/5
2017/0336716 A1 * 11/2017 Flagello .............. G03F 7/70033

* cited by examiner

*Primary Examiner* — Hung V Nguyen
(74) *Attorney, Agent, or Firm* — Seed IP Law Group

(57) ABSTRACT

A method includes: depositing a mask layer over a substrate; directing radiation reflected from a collector of a lithography system toward the mask layer according to a pattern; blocking a portion of the radiation by a blocking structure, the blocking structure being attached to a reflector of the lithography system; forming openings in the mask layer by removing regions of the mask layer exposed to the radiation; and removing material of a layer underlying the mask layer exposed by the openings.

20 Claims, 13 Drawing Sheets

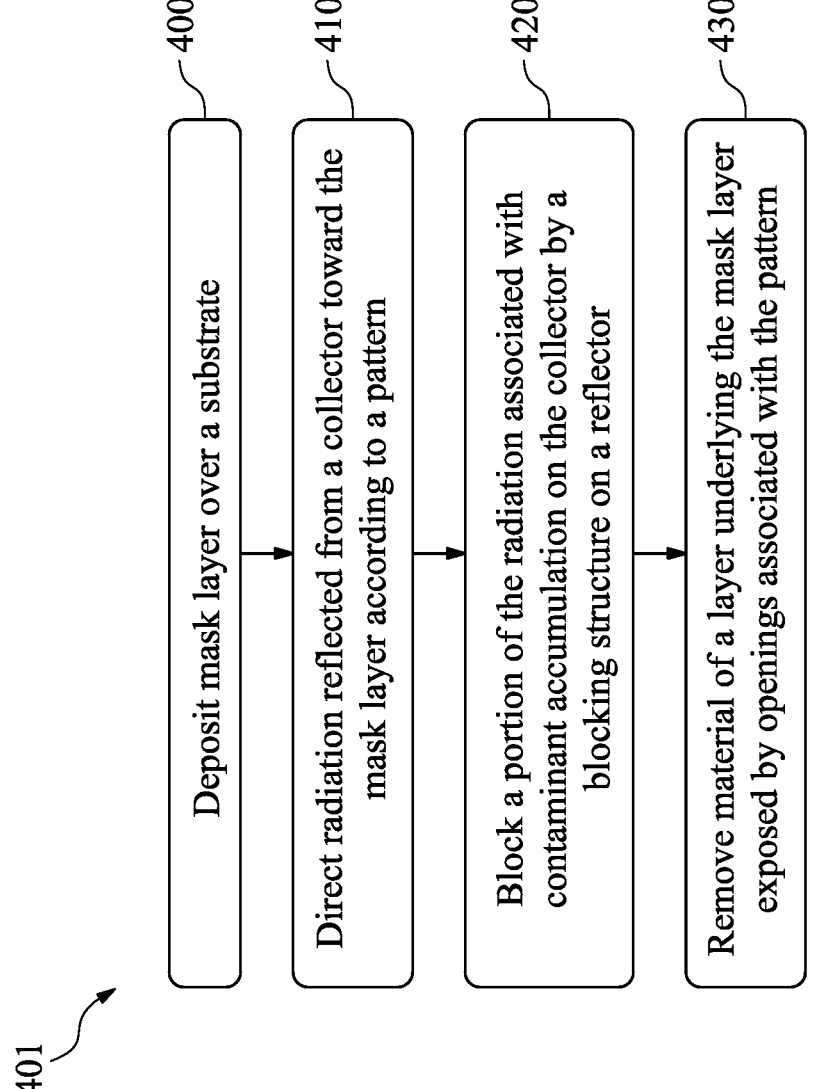

400 — Deposit mask layer over a substrate

410 — Direct radiation reflected from a collector toward the mask layer according to a pattern 420 — Block a portion of the radiation associated with contaminant accumulation on the collector by a blocking structure on a reflector 430 — Remove material of a layer underlying the mask layer exposed by openings associated with the pattern

LITHOGRAPHY SYSTEM AND METHODS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 and 5 are views illustrating methods of fabricating a device according to various embodiments of the present disclosure.

DETAILED DESCRIPTION

Figure 1A:
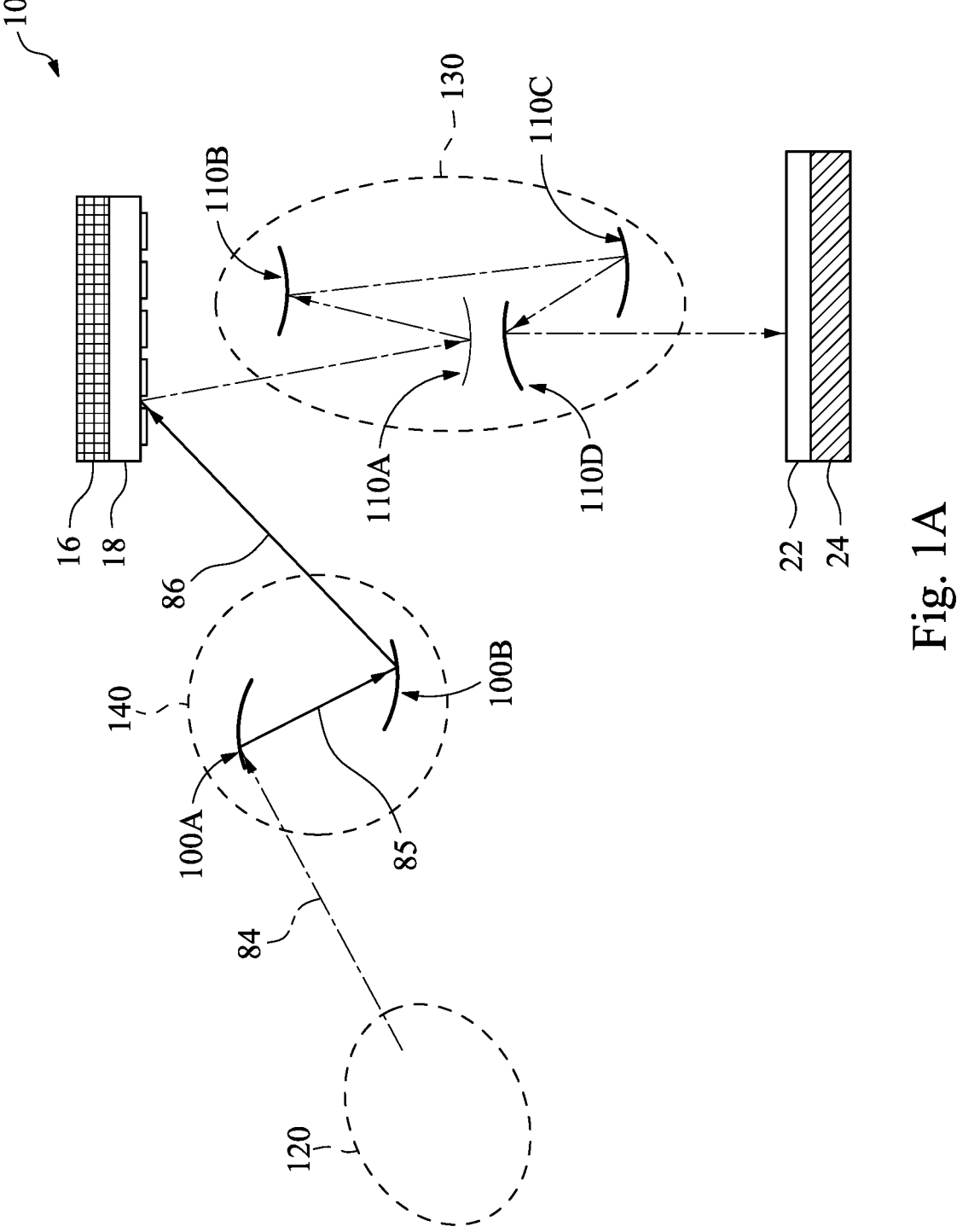
FIGS. 1A-1D are views of portions of a lithography scanner according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

The present disclosure is generally related to lithography equipment for fabricating semiconductor devices, and more particularly to a collector that is part of a light source. Dimension scaling (down) is increasingly difficult in advanced technology nodes. Lithography techniques employ ever shorter exposure wavelengths, including deep ultraviolet (DUV; about 193-248 nanometers), extreme ultraviolet (EUV; about 10-100 nanometers; particularly 13.5 nanometers), and X-ray (about 0.01-10 nanometers) to ensure accurate patterning at the scaled-down dimensions. EUV light is generated by a light source, and reflected toward a wafer by multiple mirrors and a reflective mask. Only a fraction of the EUV light reaches the wafer, such that increasing intensity of EUV light generated by the light source is a topic of much interest.

A typical EUV scanner includes a collector for focusing light scattered from a laser pulse incident on a droplet of material, such as tin. The collector includes a highly-polished mirror surface that is concave with a generally circular cross-section. In most configurations, the collector has an opening located at its center, and a light source, such as a laser, emits one or more laser pulses from behind the collector through the opening to strike the droplet as it traverses space in front of the collector. It is desirable for the collector to have large EUV conversion efficiency, which boosts wafer per day (WPD) throughput. Tin contamination or buildup on the mirror surface of the collector can lead to reduced EUV power output, and over time, to EUV scanner down time while the mirror surface is cleaned, replaced, recalibrated, and the like.

In the embodiments of this disclosure, an EUV scanner includes a mirror along an optical path between the collector and a reticle. Mirror slits (or facets) of the mirror may be blocked on an individual basis by a blocking structure attached to the mirror. By blocking individual mirror slits that are associated with positions of the collector including tin buildup (contaminants), impact to reflectivity of the mirror is reduced, which improves power output of the EUV scanner. Blocking individual mirror slits may also reduce the need for cleaning of the collector, which reduces down time due to cleaning, replacing, recalibrating, and the like, of the collector.

FIG. 1A is a schematic and diagrammatic view of a lithography exposure system 10, in accordance with some embodiments. In some embodiments, the lithography exposure system 10 is an extreme ultraviolet (EUV) lithography system designed to expose a resist layer by EUV radiation, and may also be referred to as the EUV system 10. The lithography exposure system 10 may be an EUV scanner. The lithography exposure system 10 includes a light source 120, an illuminator 140, a mask stage 16, a projection optics module (or projection optics box (POB)) 130 and a substrate stage 24, in accordance with some embodiments. The elements of the lithography exposure system 10 can be added to or omitted, and the disclosure should not be limited by the embodiment.

The light source 120 is configured to generate light radiation having a wavelength ranging between about 1 nm and about 100 nm in certain embodiments. In one particular example, the light source 120 generates an EUV radiation with a wavelength centered at about 13.5 nm. Accordingly, the light source 120 is also referred to as an EUV radiation source. However, it should be appreciated that the light source 120 should not be limited to emitting EUV radiation. The light source 120 can be utilized to perform any high-intensity photon emission from excited target fuel.

In various embodiments, the illuminator 140 includes various refractive optic components, such as a single lens or a lens system having multiple reflectors 100A, 100B, for example lenses (zone plates) or alternatively reflective optics (for EUV lithography exposure system), such as a single mirror or a mirror system having multiple mirrors in order to direct light from the light source 120 onto the mask stage 16, particularly to a mask 18 secured on the mask stage 16. In the present embodiment where the light source 120 generates light in the EUV wavelength range, reflective optics are employed. In some embodiments, the illuminator 140 includes at least three lenses. The reflector 100A may be a field facet mirror (FFM), in some embodiments. The reflector 100B may be a pupil facet mirror (PFM) in some embodiments. The reflector 100A is configured to block radiation reflected from contaminated regions of the light source 120. The reflector 100A is described in greater detail with reference to FIGS. 2A-2D.

The mask stage 16 is configured to secure the mask 18. In some embodiments, the mask stage 16 includes an electrostatic chuck (e-chuck) to secure the mask 18. This is because gas molecules absorb EUV radiation and the lithography exposure system for the EUV lithography patterning is maintained in a vacuum environment to avoid EUV intensity loss. In the present disclosure, the terms mask, photomask, and reticle are used interchangeably. In the present embodiment, the mask 18 is a reflective mask. One exemplary structure of the mask 18 includes a substrate with a suitable material, such as a low thermal expansion material (LTEM) or fused quartz. In various examples, the LTEM includes $TiO_2$ doped $SiO_2$, or other suitable materials with low thermal expansion. The mask 18 includes a reflective multilayer deposited on the substrate.

The projection optics module (or projection optics box (POB)) 130 is configured for imaging the pattern of the mask 18 on to a semiconductor wafer 22 secured on the substrate stage 24 of the lithography exposure system 10. In some embodiments, the POB 130 has refractive optics (such as for a UV lithography exposure system) or alternatively reflective optics (such as for an EUV lithography exposure system) in various embodiments. The light directed from the mask 18, carrying the image of the pattern defined on the mask, is collected by the POB 130. The illuminator 140 and the POB 130 are collectively referred to as an optical module of the lithography exposure system 10. In some embodiments, the POB 130 includes at least six reflective optics. In some embodiments, the POB 130 includes a first mirror 110A, a second mirror 110B, a third mirror 110C and a fourth mirror 110D.

In the present embodiment, the semiconductor wafer 22 may be made of silicon or other semiconductor materials. Alternatively or additionally, the semiconductor wafer 22 may include other elementary semiconductor materials such as germanium (Ge). In some embodiments, the semiconductor wafer 22 is made of a compound semiconductor such as silicon carbide (SiC), gallium arsenic (GaAs), indium arsenide (InAs), or indium phosphide (InP). In some embodiments, the semiconductor wafer 22 is made of an alloy semiconductor such as silicon germanium (SiGe), silicon germanium carbide (SiGeC), gallium arsenic phosphide (GaAsP), or gallium indium phosphide (GaInP). In some other embodiments, the semiconductor wafer 22 may be a silicon-on-insulator (SOI) or a germanium-on-insulator (GOI) substrate.

In addition, the semiconductor wafer 22 may have various device elements. Examples of device elements that are formed in the semiconductor wafer 22 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, resistors, capacitors, other applicable elements, combinations thereof, or the like. Various processes are performed to form the device elements, such as deposition, etching, implantation, photolithography, annealing, and/or other suitable processes. In some embodiments, the semiconductor wafer 22 is coated with a resist layer sensitive to the EUV radiation in the present embodiment. Various components including those described above are integrated together and are operable to perform lithography processes.

The lithography exposure system 10 may further include other modules or be integrated with (or be coupled with) other modules, such as a cleaning module designed to provide hydrogen gas to the light source 120. The hydrogen gas helps reduce contamination in the light source 120. Further description of the light source 120 is provided with reference to FIG. 1B.

Figure 1B:
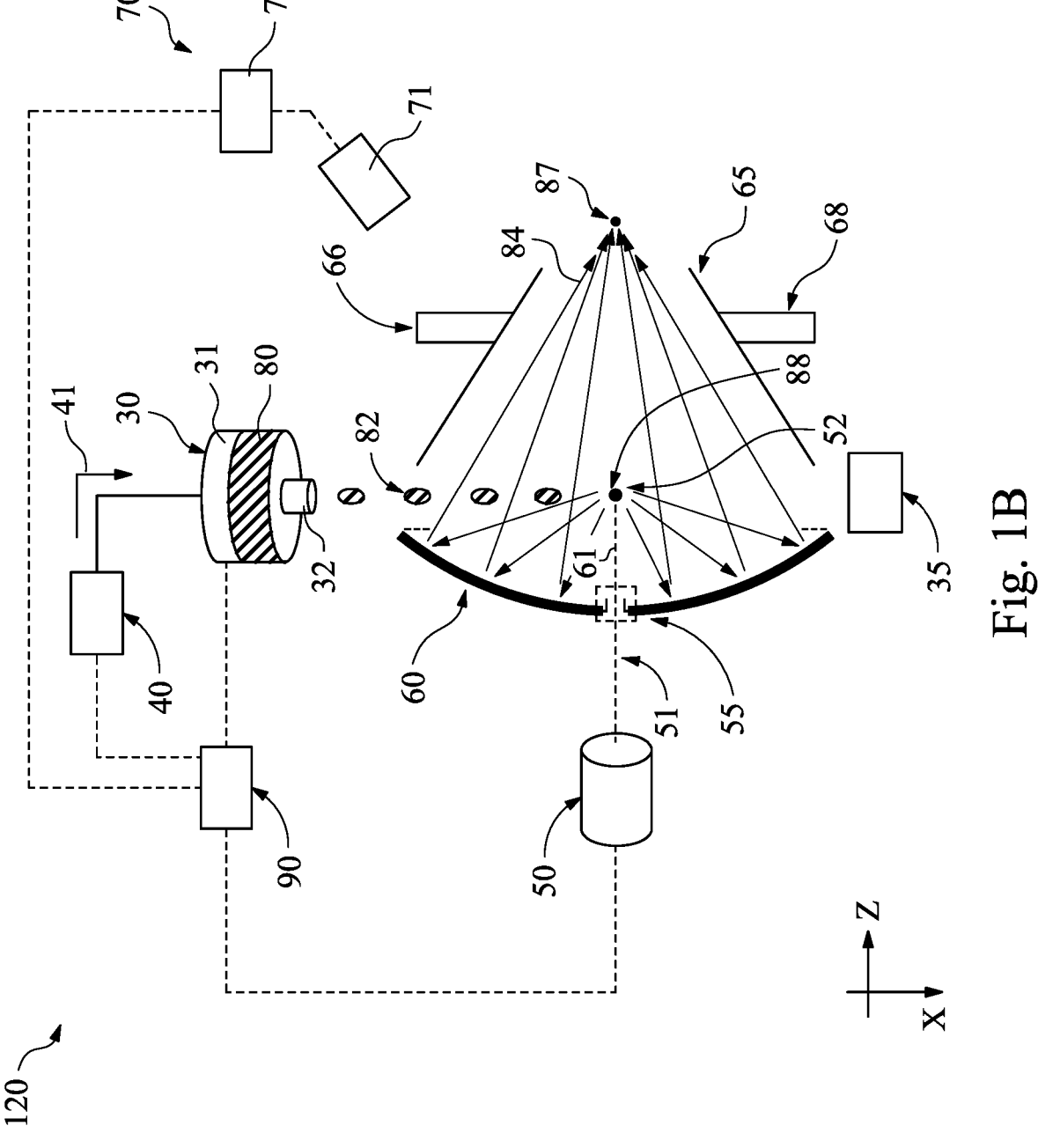

In FIG. 1B, the light source 120 is shown in a diagrammatical view, in accordance with some embodiments. In some embodiments, the light source 120 employs a dual-pulse laser produced plasma (LPP) mechanism to generate plasma 88 and further generate EUV radiation from the plasma. The light source 120 includes a droplet generator 30, a droplet receptacle 35, a laser generator 50, a laser produced plasma (LPP) collector 60 (also referred to as "collector 60"), a monitoring device 70 and a controller 90. Some or all of the above-mentioned elements of the light source 120 may be held under vacuum. It should be appreciated that the elements of the light source 120 can be added to or omitted, and should not be limited by the embodiment.

The droplet generator 30 is configured to generate a plurality of droplets 82, which may be elongated, of a target fuel 80 to a zone of excitation at which at least one laser pulse 51 from the laser generator 50 hits the droplets 82 along an x-axis, as shown in FIG. 1B. In an embodiment, the target fuel 80 includes tin (Sn). In an embodiment, the droplets 82 may be formed with an elliptical shape. In an embodiment, the droplets 82 are generated at a rate of about 50 kilohertz (kHz) and are introduced into the zone of excitation in the light source 120 at a speed of about 70 meters per second (m/s). Other material can also be used for the target fuel 80, for example, a tin containing liquid material such as eutectic alloy containing tin, lithium (Li), and xenon (Xe). The target fuel 80 in the droplet generator 30 may be in a liquid phase.

The laser generator 50 is configured to generate at least one laser pulse to allow the conversion of the droplets 82 into plasma 88. In some embodiments, the laser generator 50 is configured to produce a laser pulse 51 to the lighting point 52 to convert the droplets 82 to plasma 88 which generates EUV radiation 84. The laser pulse 51 is directed through window (or lens or opening) 55, and irradiates droplets 82 at the lighting point 52. The window 55 is formed in the collector 60 and adopts a suitable material substantially transparent to the laser pulse 51. The droplet receptacle 35 catches and collects unused droplets 82 and/or scattered material of the droplets 82 resulting from the laser pulse 51 striking the droplets 82.

The plasma emits EUV radiation 84, which is collected by the collector 60. The collector 60 further reflects and focuses the EUV radiation 84 for the lithography processes performed through an exposure tool. In some embodiments, the collector 60 has an optical axis 61 which is parallel to the z-axis and perpendicular to the x-axis. The collector 60 may includes at least two collector sections, such as a central collector section and a peripheral collector section, which may be arranged as concentric rings and separated from each other by a gap. The collector 60 may include a vessel wall 65 having first and second pumps 66, 68 attached thereto. In some embodiments, the first and second pumps 66, 68 include scrubbers configured to remove particulates and/or gases from the collector 60. The first and second pumps 66, 68 may be collectively referred to as "the pumps 66, 68" herein.

In an embodiment, the laser generator 50 is a carbon dioxide (CO2) laser source. In some embodiments, the laser generator 50 is used to generate the laser pulse 51 with single wavelength. The laser pulse 51 is transmitted through an optic assembly for focusing and determining incident angle of the laser pulse 51. In some embodiments, the laser pulse 51 has a spot size of about 200-300 µm, such as 225 µm. The laser pulse 51 is generated to have certain driving power to meet wafer production targets, such as a throughput of 125 wafers per hour (WPH). For example, the laser pulse 51 is equipped with about 23 kW driving power. In various embodiments, the driving power of the laser pulse 51 is at least 20 kW, such as 27 kW.

The monitoring device 70 is configured to monitor one or more conditions in the light source 120 so as to produce data for controlling configurable parameters of the light source 120. In some embodiments, the monitoring device 70 includes a metrology tool 71 and an analyzer 73. In cases where the metrology tool 71 is configured to monitor condition of the droplets 82 supplied by the droplet generator 30, the metrology tool may include an image sensor, such as a charge coupled device (CCD), complementary metal oxide semiconductor sensor (CMOS) sensor or the like. The metrology tool 71 produces a monitoring image including image or video of the droplets 82 and transmits the monitoring image to the analyzer 73. In cases where the metrology tool 71 is configured to detect energy or intensity of the EUV light 84 produced by the droplet 82 in the light source 12, the meteorology tool 71 may include a number of energy sensors. The energy sensors may be any suitable sensors that are able to observe and measure energy of electromagnetic radiation in the ultraviolet region. In some embodiments, the metrology tool 71 produces a collector image including image or video of contamination (e.g., tin debris) collection on the collector 60.

The analyzer 73 is configured to analyze signals produced by the metrology tool 71 and outputs a detection signal to the controller 90 according to an analyzing result. For example, the analyzer 73 includes an image analyzer. The analyzer 73 receives the data associated with the images transmitted from the metrology tool 71 and performs an image analysis process on the images of the droplets 82 in the excitation zone. Afterwards, the analyzer 73 sends data related to the analysis to the controller 90. The analysis may include a flow path error or a position error.

In some embodiments, two or more metrology tools 71 are used to monitor different conditions of the light source 120. One is configured to monitor condition of the droplets 82 supplied by the droplet generator 30, and the other is configured to detect energy or intensity of the EUV light 84 produced by the droplet 82 in the light source 120. In some embodiments, the metrology tool 71 is a final focus module and positioned in the laser source 50 to detect light reflected from the droplet 82.

Figures 3A, 3B, 3C:
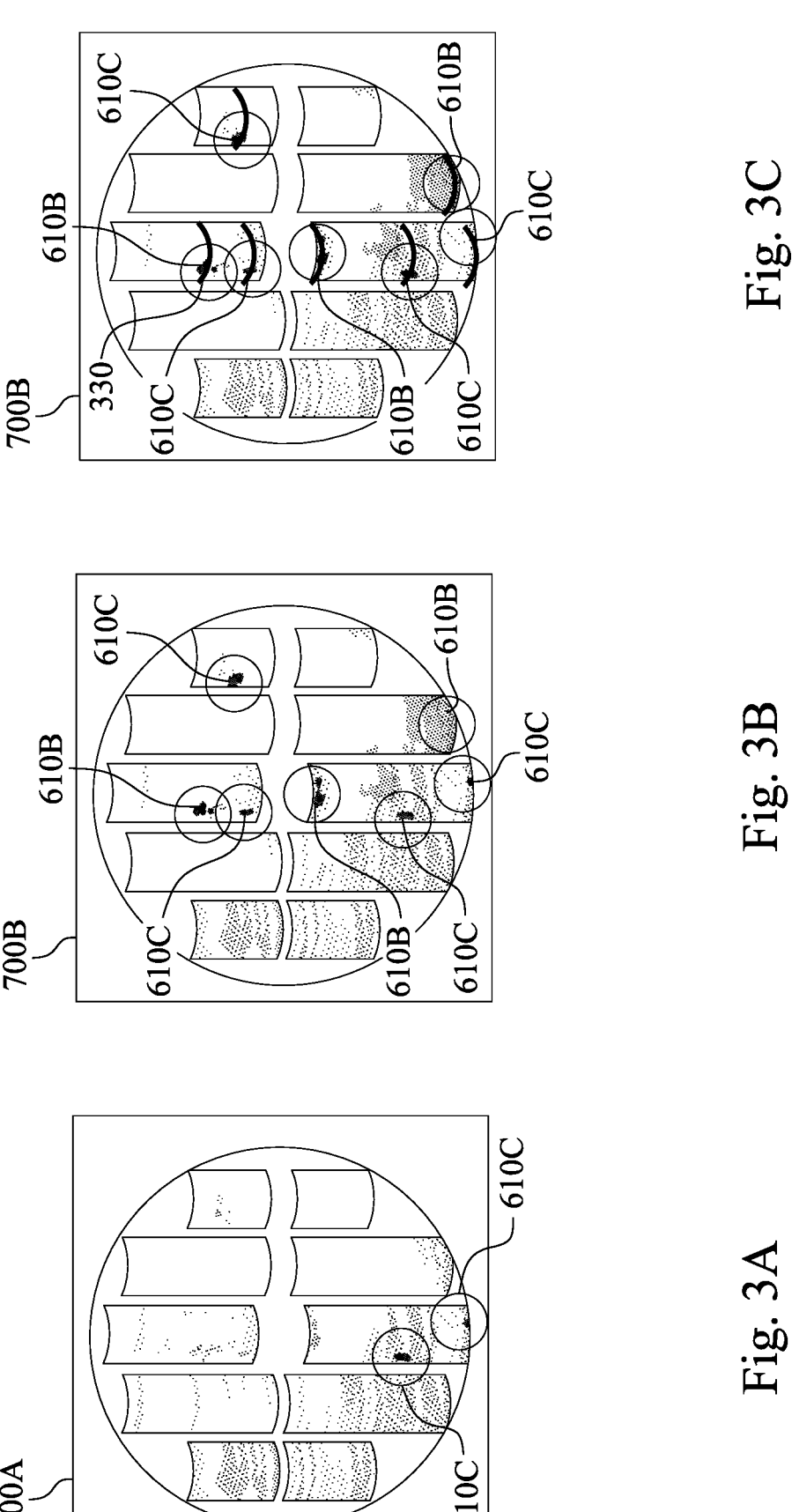
FIGS. 3A-3D are views illustrating blocking light incident on a reflector in accordance with various embodiments.

In some embodiments, the metrology tools 71 include a metrology tool, such as an imager, configured to analyze exposure of the wafer 22. The monitoring device 70 or another analyzing device of the lithography system 10 may generate an image that illustrates intensity of light incident on the reflector 100A based on exposure of the wafer 22. Example images 700A, 700B are illustrated in FIGS. 3A and 3B, and are described in greater detail with reference to FIGS. 3A and 3B.

The controller 90 is configured to control one or more elements of the light source 120. In some embodiments, the controller 90 is configured to drive the droplet generator 30 to generate the droplets 82. In addition, the controller 90 is configured to drive the laser generator 50 to fire the laser pulse 51. The generation of the laser pulse 51 may be controlled to be associated with the generation of droplets 82 by the controller 90 so as to make the laser pulse 51 hit each target 82 in sequence. The controller 90 may also be configured to drive the monitoring device 70 to perform the functions described above.

In some embodiments, the droplet generator 30 includes a reservoir 31 and a nozzle assembly 32. The reservoir 31 is configured for holding the target material 80. In some embodiments, one gas line 41 is connected to the reservoir 31 for introducing pumping gas, such as argon, from a gas source 40 into the reservoir 31. By controlling the gas flow in the gas line 41, the pressure in the reservoir 31 can be manipulated. For example, when gas is continuously supplied into the reservoir 31 via the gas line 41, the pressure in the reservoir 31 increases. As a result, the target material 80 in the reservoir 31 can be forced out of the reservoir 31 in the form of droplets 82.

Figures 1C, 1D:
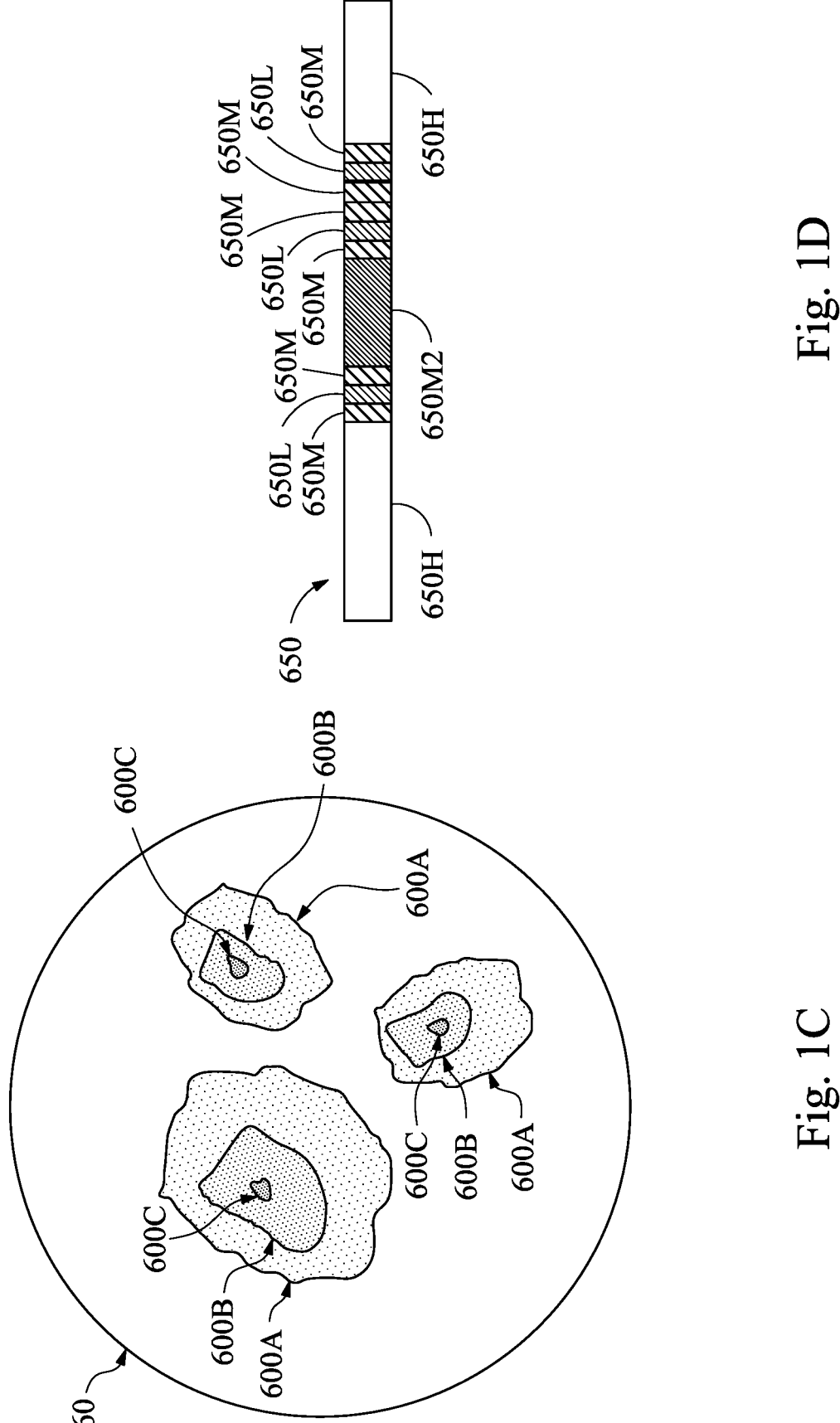

FIG. 1C is a diagram illustrating a top view of the collector 60 in accordance with various embodiments. In some embodiments, the collector 60 includes material such as stainless steel, or the like, and may further include one or more coatings of another material, such as Ru, $ZrN/ZrO_2$ multilayers, or other suitable material for providing a mirror surface. In some embodiments, the material has Young's Modulus greater than about 200 GPa.

After a period of operation of lithography system 10, such as a few hours, a day, a week, or the like, debris from the droplets 82 may accumulate on the collector 60, as shown. The debris is illustrated by regions 600A, 600B, 600C. In some embodiments, the regions 600A-600C include first regions 600A, second regions 600B and third regions 600C. Density of debris, such as tin debris, may be higher in the third regions 600C than in the second regions 600B, and may be higher in the second regions 600B than the first regions 600A. The debris may be in the form of drops, drips, haze or other forms. The third regions 600C may reduce exposure of the wafer 22, such that uniformity and intensity of light incident on the wafer 22 is reduced. For example, the light incident on the reflector 100A may be transformed into a horizontal slit light 650 (see FIG. 1D) by the reflector 100A and the reflector 100B.

As shown in FIG. 1D, due to the debris accumulated on the collector 60, the horizontal slit light 650 may have regions 650L, 650M, 650H of different intensity. For example, the regions 650H may be regions of high or normal (e.g., unaffected) intensity, the regions 650M may be regions of medium (e.g., partially reduced) intensity, and the regions 650L may be regions of low (e.g., reduced) intensity. The regions 650L may correspond to the regions 600C, the regions 650M may correspond to the regions 600B, 600A, and the regions 650H may correspond to remaining regions of the collector 60. In some embodiments, a region 650M2 may correspond to regions of overlap of the regions 600A, the regions 600B, or both of the collector 60. Intensity in the region 650M2 may be between those of the regions 650M and 650L. Instead of, or in addition to, partially blocking the regions 650H having high intensity, which uniformly reduces intensity of reflected light from a column of the reflecting slits 210, embodiments of the disclosure provide methods and structures that block a single reflecting slit 210 associated with the position of debris (e.g., the region 600C) on the collector 60. As such, loss of intensity in the horizontal slit light 650 is reduced, corresponding to increased WPH throughput.

Figure 2A:
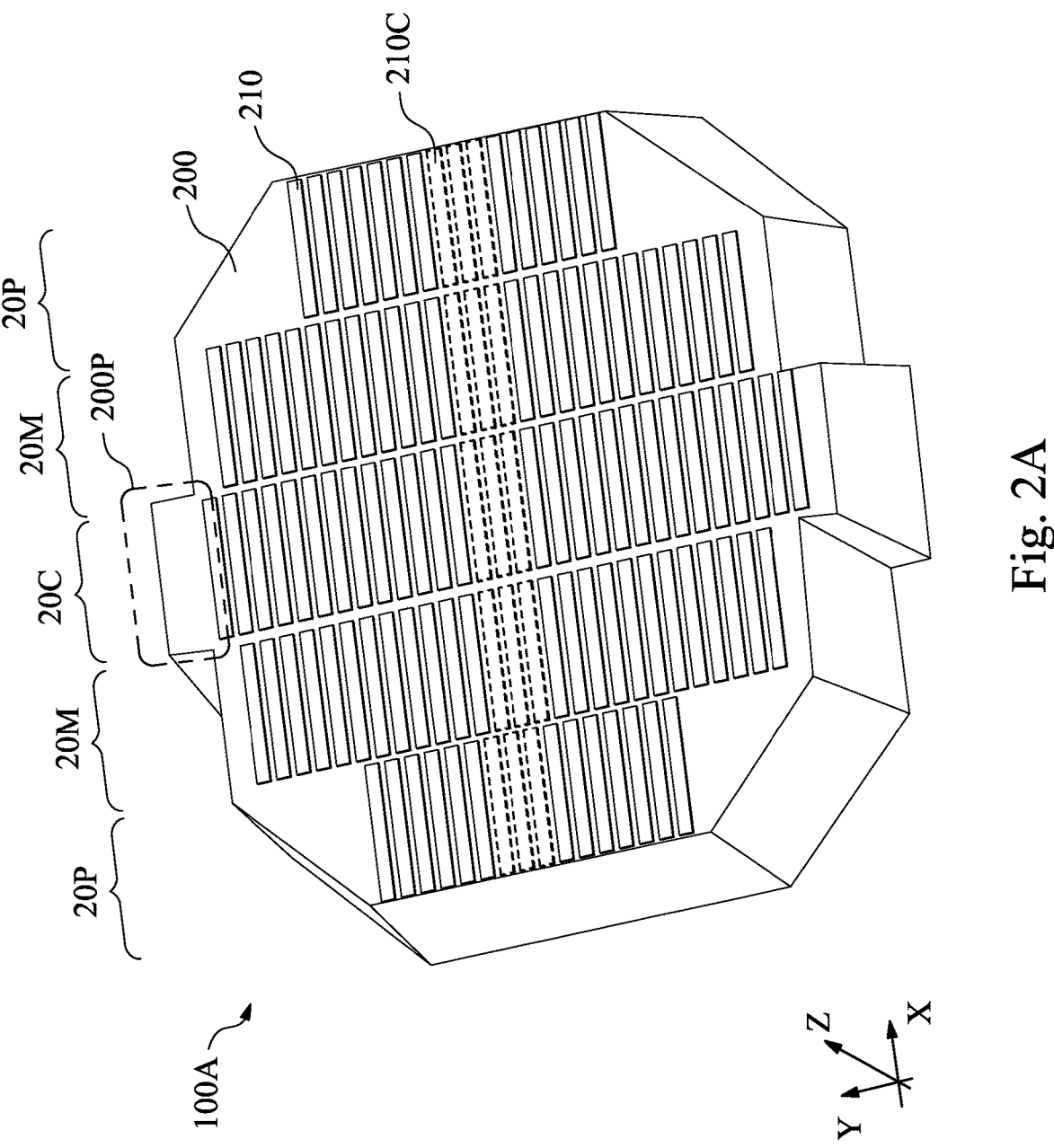
FIGS. 2A-2G are views of a reflector and blocking structure of the lithography scanner according to various embodiments of the present disclosure.
Figure 2B:
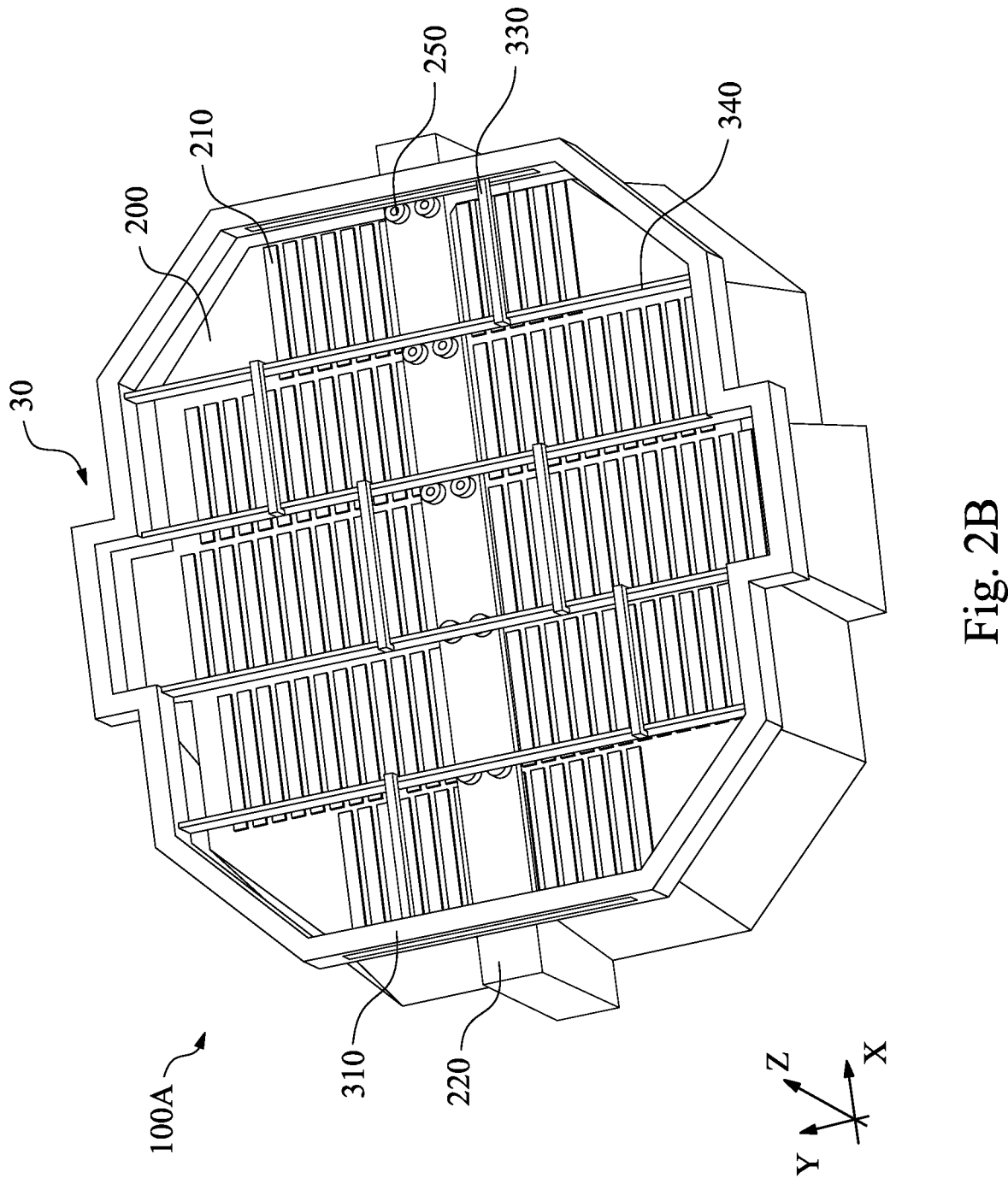
Figure 2C:
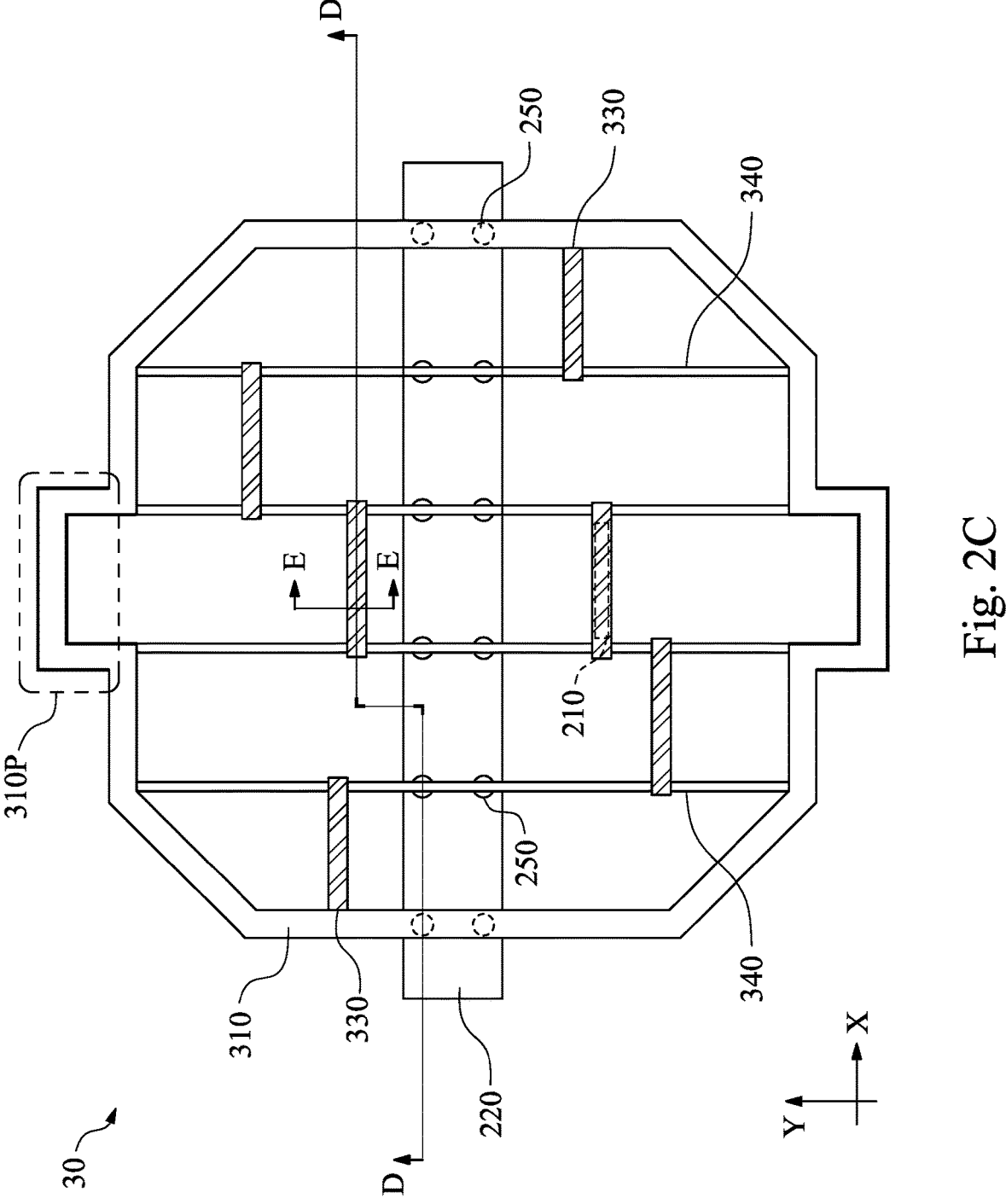
Figure 2D:
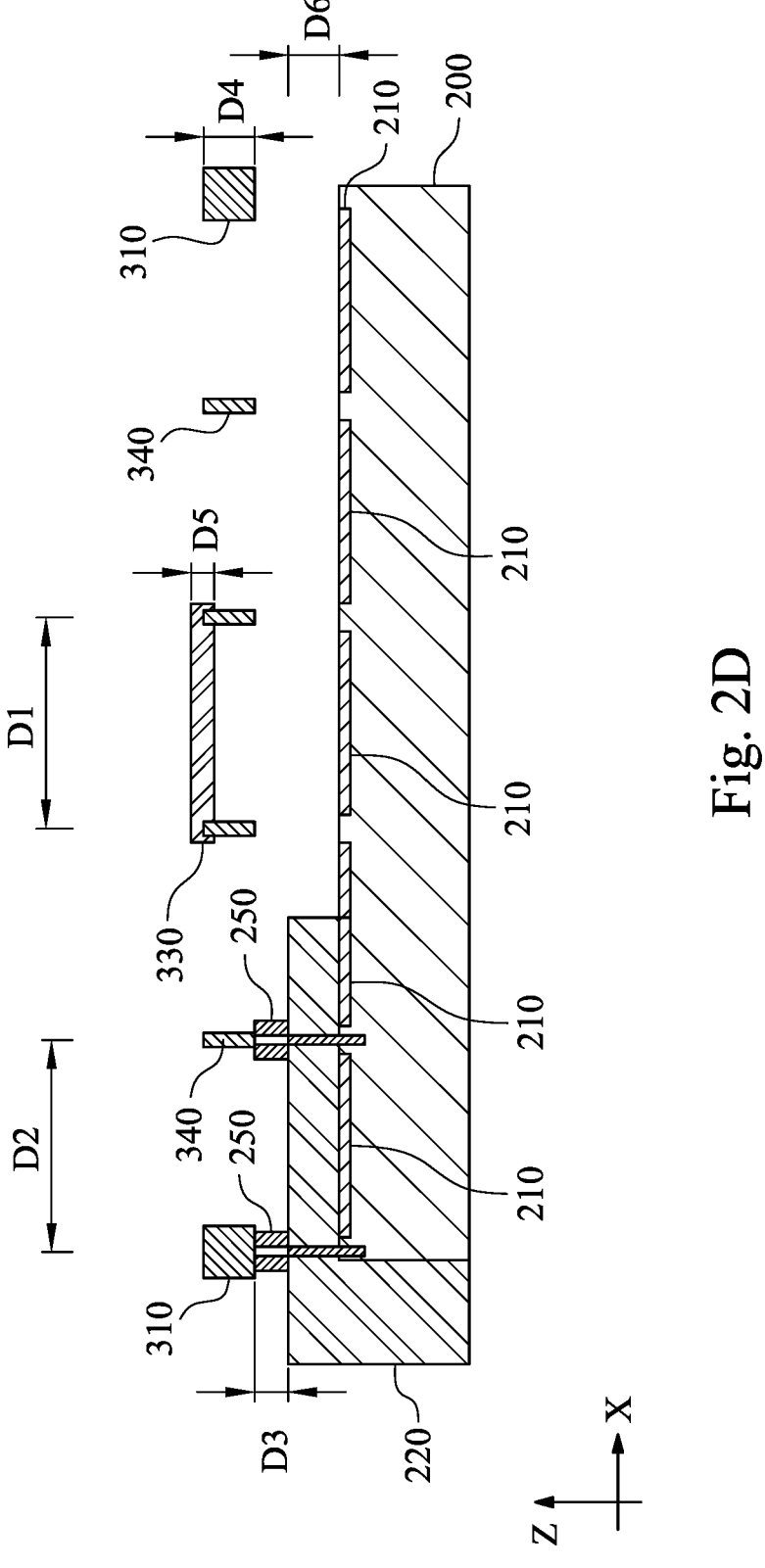
Figure 2F:
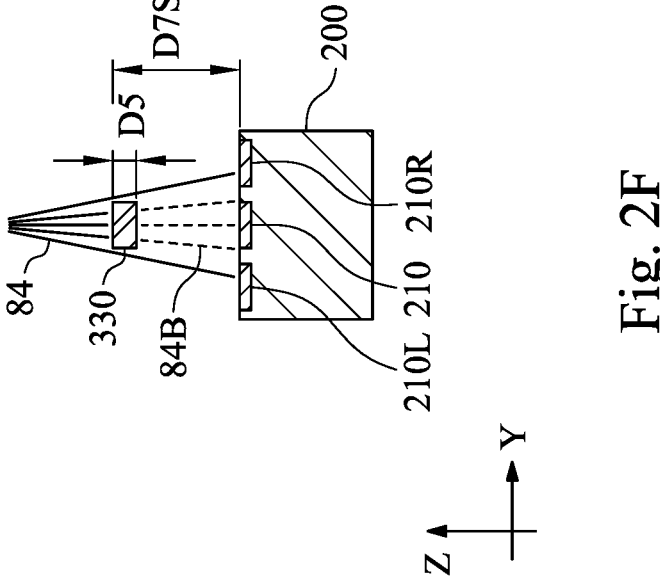
Figure 2E:
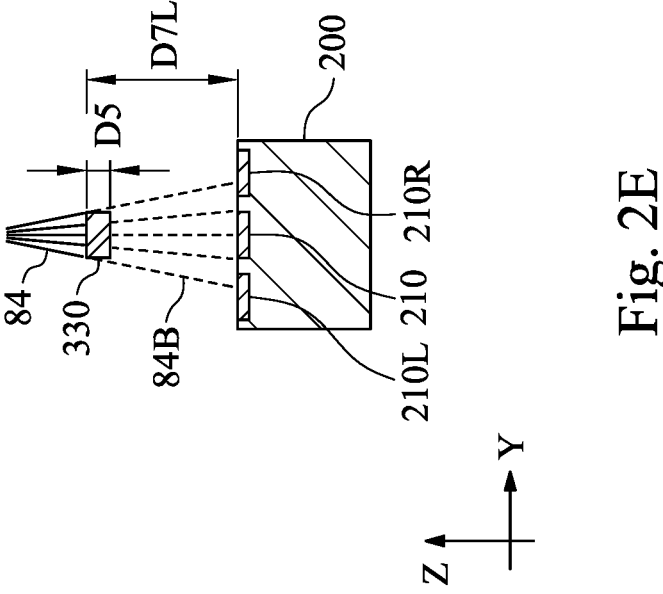
Figure 2G:
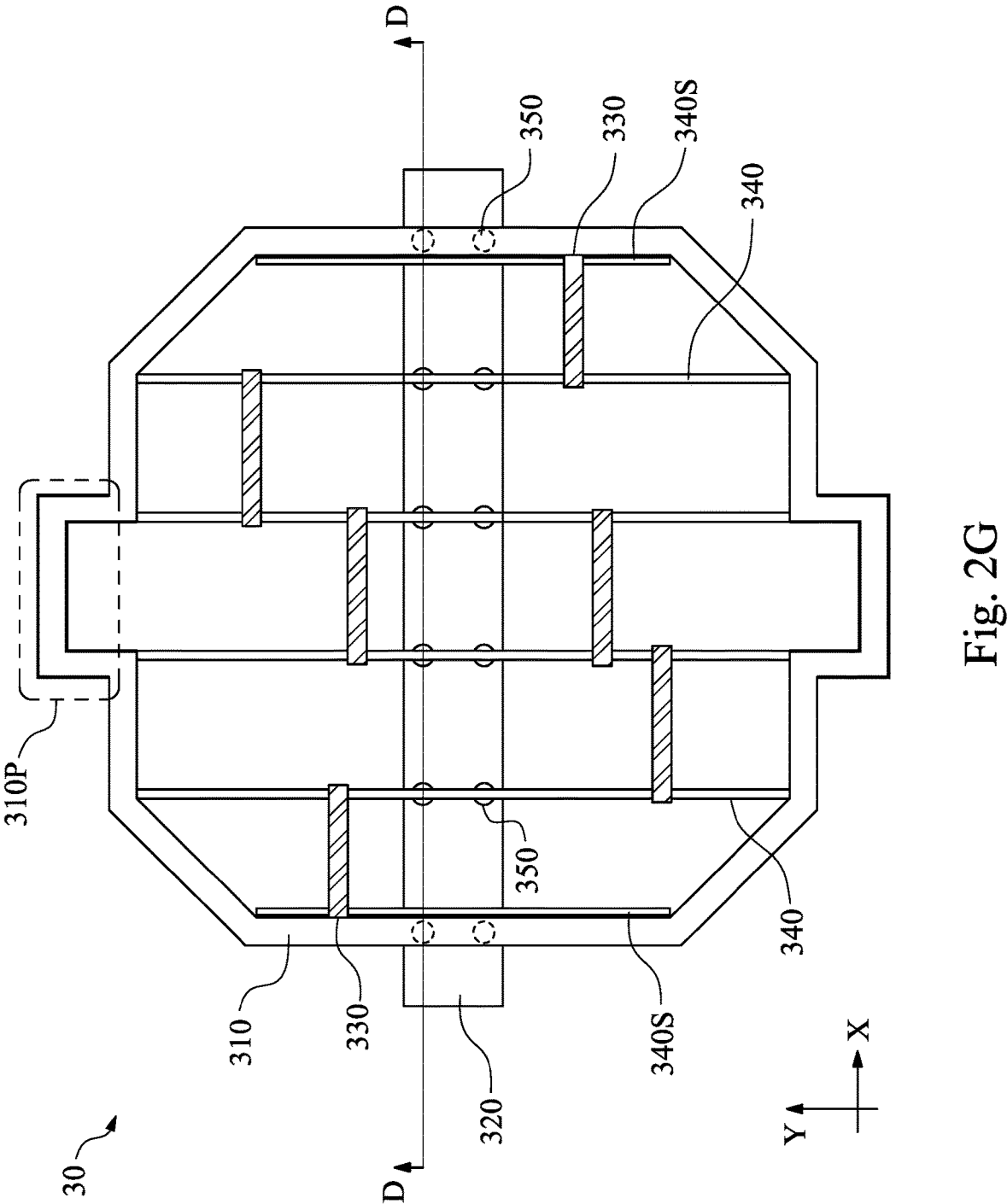

FIGS. 2A-2G are various views of the reflector 100A and blocking structure 30 in accordance with various embodiments. FIG. 2A is a perspective view of the reflector 100A. FIG. 2B is a perspective view showing a blocking structure 30 in accordance with various embodiments. FIG. 2C is a top view of the blocking structure 30. FIG. 2D is a cross-sectional side view of the blocking structure 30 and the reflector 100A along line D-D of FIG. 2C. FIGS. 2E and 2F are cross-sectional side views of the blocking structure 30 and the reflector 100A along line E-E of FIG. 2C. FIG. 2G is a top view of the blocking structure 30 in accordance with various embodiments.

FIG. 2A shows the reflector 100A in perspective view in accordance with various embodiments. Some elements of the reflector 100A may be omitted in FIG. 2A for clarity of illustration. For example, a fastening structure 220 shown in FIG. 2B is omitted from view in FIG. 2A to clearly illustrate optional central reflecting slits (or facets) 210C in FIG. 2A. In some embodiments, the reflector 100A is a field facet mirror (FFM) of an EUV lithography system, such as an EUV stepper. The reflector 100A includes a body 200 and reflecting slits or facets 210. The body 200 may be substantially octagonal in profile (e.g., in the XY plane), with protruding portions 200P positioned on either side of the body 200 along the Y-axis direction, as shown.

In some embodiments, the reflecting slits 210 and the optional central reflecting slits 210C are arranged in columns 20C, 20M, 20P, as shown in FIG. 2A. The columns 20C, 20M, 20P include a center column 20C, peripheral columns 20P and intermediate columns 20M. The intermediate columns 20M are positioned between the center column 20C and either of the peripheral columns 20P. Two intermediate columns 20M are shown in FIG. 2A. In some embodiments, more than two intermediate columns 20M (e.g., four) are positioned between the center column 20C and the peripheral columns 20P.

Each of the reflecting slits 210 and optional central reflecting slits 210C has width in the X-axis direction (or "first direction"), length in the Y-axis direction (or "second direction") and height in the Z-axis direction (or "third direction"). In some embodiments, the X-axis direction, the Y-axis direction and the Z-axis direction are orthogonal to each other. The reflecting slits 210 may all have substantially the same or the same dimensions (e.g., width, length and height) as each other. The reflecting slits 210 may be mirror segments, and may include a multilayer structure including alternating layers of materials such as silicon, molybdenum, strontium, ruthenium, or the like. The reflecting slits 210 may be embedded in the body 200. For example, upper surfaces of the reflecting slits 210 may be substantially coplanar with the upper surface of the body 200 (see, for example, FIG. 2D). In some embodiments, the upper surfaces of the reflecting slits 210 extend to a level slightly above or slightly below the upper surface of the body 200. The reflecting slits 210 may be configured to pivot or rotate, for example, around the X-axis direction. In some embodiments, the optional central reflecting slits 210C are omitted, and the body extends continuously instead.

FIG. 2B illustrates the blocking structure 30 attached to the reflector 100A in accordance with various embodiments. The blocking structure 30 includes a frame 310, at least two rails 340 and at least one blocking element 330. The blocking structure 30 may be configured to block or cover one or more reflecting slits 210 of the reflector 100A.

In some embodiments, the frame 310 has shape that is similar to or the same as the perimeter of the body 200. For example, the frame 310 may be substantially octagonal in shape, and may include protruding portions 310P, as shown in FIG. 2C. The frame 310 may be rigid, and may be attached (e.g., mounted) to the reflector 100A. The attaching may be by fasteners, such as screws, an adhesive, or other suitable structures, materials, or both.

The rails 340 extend in a first direction, such as the Y-axis direction. The rails 340 may overlap or be aligned with lanes that extend between the columns 20C, 20M, 20P along the Y-axis direction. The lanes are areas of the body 200 between the columns 20C, 20M, 20P which are free of reflective slits 210. By positioning the rails 340 over the lanes, obstruction of light incident to the reflective slits 210 may be reduced.

Figure 3D:
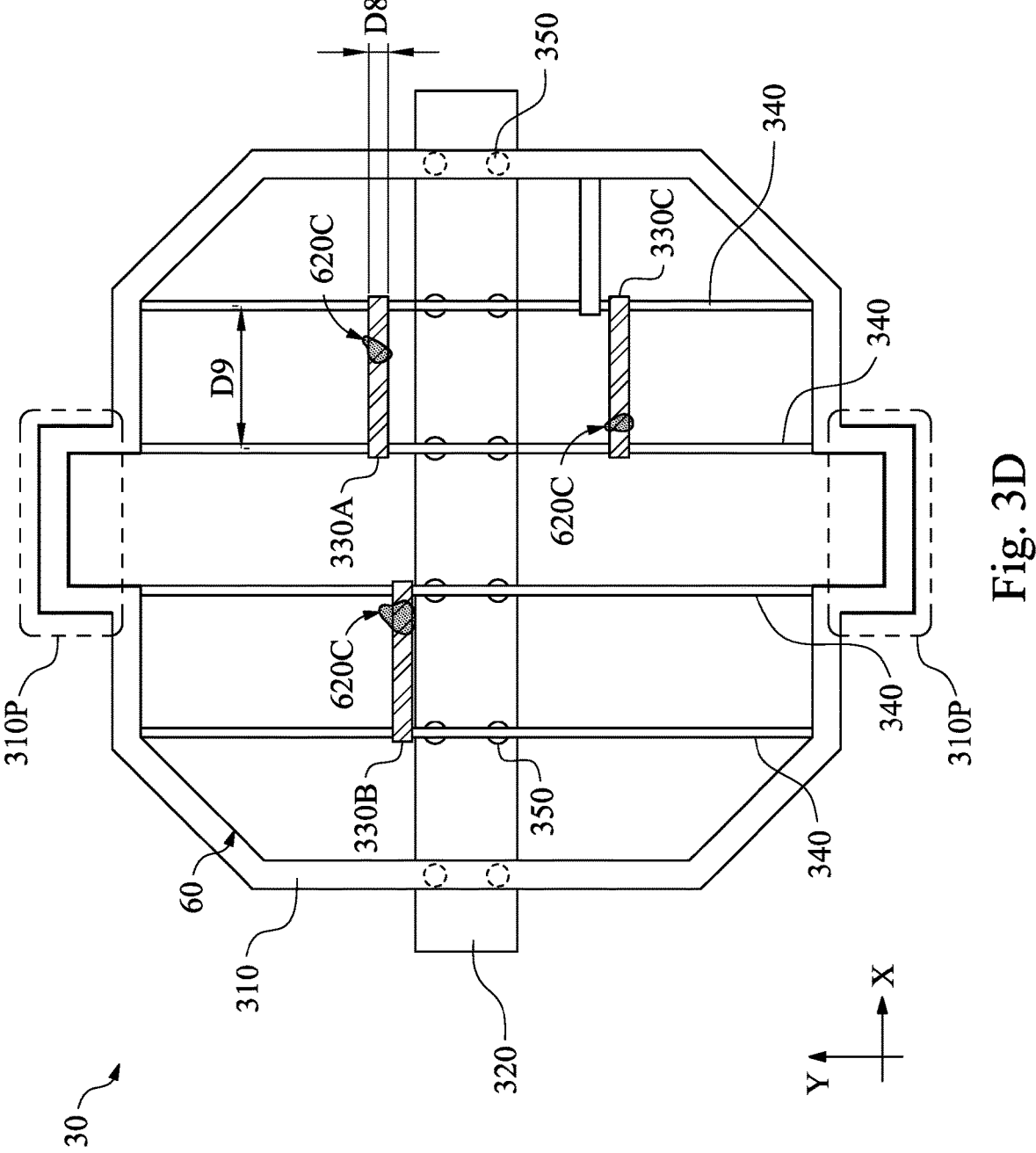

The blocking elements 330 have width in the X-axis direction (or "first direction"), length in the Y-axis direction (or "second direction") and height in the Z-axis direction (or "third direction"). The width is illustrated in FIG. 3D by dimension D9, the length is illustrated in FIG. 3D by dimension D8, and the height is illustrated in FIG. 2D by dimension D5. Referring to FIG. 2C and FIG. 2D, each of the blocking elements 330 may have profile in the XY plane that is the same or substantially the same as the profile of the reflecting slit 210 in the XY plane. For example, as shown in FIG. 2C, the length of the blocking element 330 may be the same or substantially the same as the length of the reflecting slit 210 (shown in phantom in FIG. 2C). In some embodiments, the length of the blocking element 330 is the same or somewhat larger than the length of the reflecting slit 210. If the length of the blocking element 330 is too large, the blocking element 330 may obstruct light incident on one or more reflecting slits 210 neighboring the reflecting slit 210 blocked by the blocking element 330.

FIG. 2D illustrates a cross-sectional side view of the blocking structure 30 attached to the reflector 100A in accordance with various embodiments. As shown in FIG. 2D, neighboring pairs of the rails 340 may be separated by a first distance D1. The rails 340 that are directly adjacent the frame 310 may be separated from the frame by a second distance D2. The fastening structure 220 may be mounted to the body 200 by fasteners 250, and may extend above the upper surface of the body 200 by a distance D6. Each of the fasteners 250 may include a screw, for example. The fasteners 250 may extend above the fastening structure 220 by a height D3 in the Z-axis direction. While the rails 340 may not be mounted or attached directly to the fasteners 250, the rails 340 and the fasteners 250 are both aligned with the lanes between the reflecting slits 210, as shown in FIG. 2D. As such, the blocking elements 330, which are attached to the rails 340, are separated from the reflecting slits 210 by a distance roughly equal to (e.g., somewhat less than) the sum of the distances D6, D3, D4. The blocking elements 330 may have height D5 in the Z-axis direction.

FIGS. 2E and 2F illustrate a cross-sectional side view of the blocking element 330 over the reflecting slit 210 in accordance with various embodiments. The reflecting slit 210 is directly adjacent to a first or left reflecting slit 210L and a second or right reflecting slit 210R. Distance D7L shown in FIG. 2E is a long distance between the upper surface of the blocking element 330 and the upper surface of the body 200, the reflecting slit 210, or both. Distance D7S shown in FIG. 2F is a short distance between the upper surface of the blocking element 330 and the upper surface of the body 200, the reflecting slit 210, or both. The distance D7S is shorter than the distance D7L. When the distance D7L is large, light 84 that is incident on the reflector 100A from the collector 60 is blocked by the blocking element 330, as shown in phantom by lines 84B corresponding to blocked light. As shown in FIG. 2E, some light 84 that would be incident on the first and second reflecting slits 210L, 210R is instead blocked by the blocking element 330. Reducing the distance between the blocking element 330 and the reflecting slits 210, 210L, 210R, as shown in FIG. 2F, allows an increased amount of light 84 to reach the first and second reflecting slits 210L, 210R. Referring again to FIG. 2D, reducing height D6 of the fastening structure 220, extension D3 of the fasteners 250, height D4 of the frame 310 and the rails 340, height D5 of the blocking element 330, or a combination thereof, reduces the distance (e.g., the distance D7S) shown in FIG. 2E or FIG. 2F, which increases amount of light 84 reflected by the reflector 100A.

The blocking elements 330 may be attached to the rails 340, the frame 310, or both. In some embodiments, the blocking elements 330 are attached by a clip, a fastener, an adhesive, a combination thereof, or other suitable attaching structure. In some embodiments, the blocking elements 330 are removable after being attached to the rails 340, the frame 310, or both. Each of the blocking elements 330 may be or include a material that has high corrosion resistance, low outgassing, low reflectivity, or a combination thereof. In some embodiments, the material of the blocking elements 330 is or includes tungsten.

FIG. 2G illustrates the blocking structure 30 in accordance with various embodiments. In FIG. 2G, the blocking structure 30 includes rails 340S in close proximity to either side of the frame 310. By including the rails 340S, a single configuration of the blocking elements 330 may be used for each reflecting slit 210 of the reflector 100A, and the frame 310 may have a simpler design due to not being used to accommodate mounting of the blocking elements 330.

FIGS. 3A-3D illustrate blocking light incident on a mirror, such as the reflector 100A, in accordance with various embodiments. FIGS. 3A, 3B illustrate calculated images 700A, 700B that show calculated incident light on the reflector 100A associated with accumulation of contaminants on the collector 60. In some embodiments, the calculated images 700A, 700B are generated by the monitoring device 70 shown in FIG. 1B. For example, the calculated images 700A may be generated by analyzing an exposure pattern of a wafer exposed to light reflected by the reflector 100A.

In FIG. 3A, at a first time, a first calculated image 700A is generated. In the first calculated image 700A, two second positions 610C of the reflector 100A are identified. The second positions 610C are positions of the reflector 100A associated with first positions of the collector 60 having a level (e.g., density) of contaminants higher than a first level. Each of the second positions 610C may be associated with one or more reflecting slits 210 of the reflector 100A.

In FIG. 3B, at a second time following the first time by a period, such as a day, a second calculated image 700B is generated. In the second calculated image 700B, four second positions 610C of the reflector 100A are identified. The four second positions 610C may include the two second positions 610C identified in the first calculated image 700A. For example, after a day of contaminant accumulation, the collector 60 may have a greater number of positions (e.g., four) at which level of contaminants is higher than the first level than were present when generating the first calculated image 700A. Each of the second positions 610C may be associated with one or more reflecting slits 210 of the reflector 100A.

FIG. 3C shows conceptually the positioning of one or more blocking elements 330 positioned to block the reflecting slits 210 at the second positions 610C. The blocking elements 330 may be attached to the rails 340 over the reflecting slits 210, as described with reference to FIGS. 2A-2F above. In some embodiments, as shown in FIG. 3C, the blocking elements 330 may be positioned to block reflecting slits 210 at third positions 610B. The third positions 610B are positions of the reflector 100A associated with first positions of the collector 60 having a level (e.g., density) of contaminants lower than the first level and higher than a second level. The second level is lower than the first level.

FIG. 3D illustrates the blocking structure 30 with blocking elements 330 attached in accordance with various embodiments. The blocking elements 330 are attached to neighboring pairs of the rails 340. Each of the blocking elements 330 is positioned at a second position corresponding to (e.g., overlying) a reflective slit 210 (see FIG. 2B). Each of the second positions may directly overlie or overlap a reflective slit 210. Each of the reflective slits 210 having a blocking element 330 thereover may be associated with a region 620C of reduced or non-uniform light intensity due to contaminant accumulation on the collector 60. By positioning the blocking elements 330 to block individual reflective slits 210, reduction of intensity of light incident on the mask or reticle 18 may be reduced. Attaching the blocking elements 330 to the rails 340 may be accomplished in a few minutes, leading to significantly reduced downtime of the lithography exposure system 10. After an extended period of time, such as a week or month or longer, the collector 60 may be cleaned or replaced. Following cleaning or replacement of the collector 60, the blocking elements 330 may be removed until contaminants accumulate to a level above the first level described with reference to FIGS. 3A-3C.

FIG. 4 is a flowchart of a process 401 for forming a device in accordance with various embodiments. In some embodiments, the process 401 for forming the device includes a number of operations (400, 410, 420 and 430). The process 401 for forming the device will be further described according to one or more embodiments. It should be noted that the operations of the process 401 may be rearranged or otherwise modified within the scope of the various aspects. It should further be noted that additional processes may be provided before, during, and after the process 401, and that some other processes may be only briefly described herein. In some embodiments, the process 401 is performed by the lithography exposure system 10 described in FIGS. 1A-3D.

In operation 400, a mask layer is deposited over a substrate. In some embodiments, the mask layer includes a photoresist layer that is sensitive to the EUV radiation 84. In some embodiments, the substrate is a semiconductor substrate, such as the semiconductor wafer 22 (see FIG. 1A). In some embodiments, the substrate is a layer overlying the semiconductor substrate, such as a dielectric layer, a metal layer, a hard mask layer, or other suitable layer. In some embodiments, the mask layer is deposited by spin coating or other suitable process. The mask layer may include a photoresist, anti-reflective coating, combinations thereof, or the like.

In operation 410, radiation is reflected from the collector 60 toward the mask layer according to a pattern. The radiation is reflected along an optical path between the collector 60 and the mask layer, which may be on the semiconductor wafer 22. In some embodiments, the radiation is reflected according to a pattern, such as exists on the mask 18, which may be a reflective mask. The radiation may be EUV radiation, DUV radiation, or other suitable radiation.

In operation 420, a portion of the radiation associated with contaminant accumulation on the collector 60 is blocked by a blocking structure 330 on a reflector 100A. The blocking element 330 may be positioned over a location of the reflector 100A associated with contamination of the collector. In some embodiments, a second blocking element 330 may be positioned over a second location of the reflector 100A associated with contamination of the collector 60. The second blocking element 330 is offset from the blocking element 330. For example, as shown in FIG. 3D, a blocking element 330A is offset from a blocking element 330B along the X-axis direction, and is offset from a blocking element 330C along the Y-axis direction. In some embodiments, the blocking element 330 and the second blocking element 330 are attached to the same pair of rails 340. For example, the blocking element 330A and the second blocking element 330C are attached to the same pair of rails 340, as shown in FIG. 3D. In some embodiments, two blocking elements 330 are attached at a first end to a first rail 340, and are attached at second ends to different second rails 340, such as a rail 340 on the left side of the first rail 340 and a rail 340 on the right side of the first rail 340. In some embodiments, two blocking elements 330 are attached to two different pair of rails 340.

In some embodiments, the blocking element 330 is removed following removing the contamination from the collector (e.g., by cleaning the collector or replacing the collector). In some embodiments, the blocking element 330 has shape similar to or larger than a reflecting slit 210 of the reflector 100A. In some embodiments, the blocking structure 30 includes a frame 310 attached to the reflector 100A, and the blocking element 330 is attached to the frame 310, for example, as shown in FIG. 2C.

In operation 430, material of a layer underlying the mask layer is removed. In some embodiments, openings are formed in the mask layer by removing regions of the mask layer exposed to the radiation. In some other embodiments, the openings are formed by removing regions of the mask layer not exposed to the radiation. The material removed is in regions of the layer exposed by the openings in the mask layer. In some embodiments, the layer is a dielectric layer, a semiconductor layer, or other layer. Following removal of the material, the mask layer may be removed, for example, by ashing, etching or other suitable process.

Figure 5:
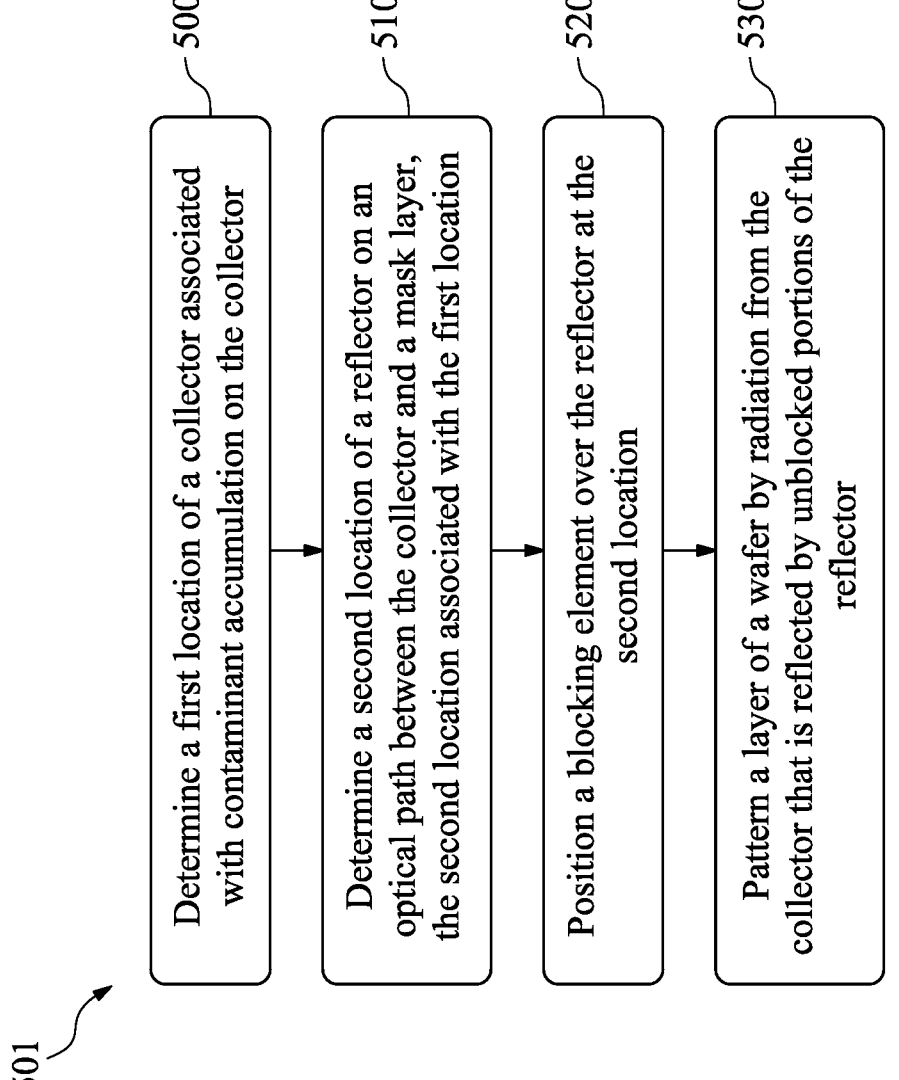

FIG. 5 is a flowchart of a process 501 for forming a device in accordance with various embodiments. In some embodiments, the process 501 for forming the device includes a number of operations (500, 510, 520 and 530). The process 501 for forming the device will be further described according to one or more embodiments. It should be noted that the operations of the process 501 may be rearranged or otherwise modified within the scope of the various aspects. It should further be noted that additional processes may be provided before, during, and after the process 501, and that some other processes may be only briefly described herein. In some embodiments, the process 501 is performed by the lithography exposure system 10 described in FIGS. 1A-3D.

In operation 500, a first location or position of a collector 60 associated with contaminant accumulation is determined. The first position may be determined using the images 700A, 700B shown in FIGS. 3A-3D, for example. In some embodiments, the first position is determined by a process including analyzing an exposure pattern on a wafer. For example, the wafer may be exposed to the radiation from the collector 60 as patterned by the mask 18 and partially blocked by the blocking elements 330.

In operation 510, a second location or position of a reflector (e.g., the reflector 100A) on an optical path between the collector 60 and a mask layer on the wafer is determined. The second location is associated with the first location or position. In some embodiments, operation 510 and operation 500 are a single operation. For example, as described with reference to FIGS. 3A-3D, the calculated image 700B may illustrate regions of non-uniform or reduced light intensity incident on the reflector 100A from the collector 60 having contaminant accumulation. For example, the collector 60 may have first regions having contaminant accumulation, and the reflector 100A may have second regions corresponding to the first regions, where the second regions have non-uniform or reduced light intensity due to the contaminant accumulation in the first regions. In some embodiments, operation 500 is omitted. For example, use of the calculated image 700B to determine the second positions may obviate any determination and/or storage (e.g., in computer memory) of the first positions. In some embodiments, the reflector 100A is most proximal the collector 60 along an optical path between the collector 60 and a reticle 18. For example, the reflector 100A may be a FFM of an EUV stepper.

In operation 520, a blocking element 330 is positioned over the reflector 100A at the second location or position. In some embodiments, the blocking element 330 is attached to a frame 310, the frame 310 being attached to the reflector 100A. In some embodiments, the blocking element 330 blocks at least one reflecting slit 210 of the reflector 100A. For example, the blocking element 330 may be shaped such that the blocking element 330 may block two adjacent reflecting slits 210. In some embodiments, the blocking element 330 has length in the Y-axis direction (see dimension D8 of FIG. 3D) that is long enough to block a region 620C of non-uniform or reduced intensity that affects two or more neighboring reflecting slits 210. In some embodiments, the blocking element 330 partially blocks one or more reflecting slits 210.

In some embodiments, the blocking element 330 includes a material having lower reflectivity than the reflecting slit 210. In some embodiments, the blocking element 330 is vertically separated from the reflecting slit 210 of the reflector 100A by a distance that is less than a dimension of the reflecting slit. For example, as shown in FIG. 2D, the blocking element 330 may be separated from the reflecting slit 210 by a distance substantially equal to the sum of distances D4, D3, D6. In some embodiments, the sum is less than one or more of the width, length, and height of the reflecting slit 210.

In operation 530, a layer of the wafer is patterned by radiation from the collector 60 that is reflected by unblocked portions of the reflector 100A. In some embodiments, the unblocked portions include reflecting slits 210 over which no blocking element 330 is positioned. The unblocked portions may be the difference between all reflecting slits 210 of the reflector 100A and the reflecting slits 210 having blocking elements 330 thereover.

Embodiments may provide advantages. By positioning the blocking element 330 over the reflecting slit 210 affected by non-uniform or reduced light intensity due to contaminant accumulation at a corresponding region of the collector 60, reduction in light intensity incident on the mask 18 is reduced. The blocking element 330 is easily attached to the rails 340 of the blocking structure 30, such that downtime of the lithography exposure system 10 is reduced. Use of the blocking element 330 allows for localized blockage of non-uniform or reduced intensity light, which increases time between cleaning or replacing the collector 60, increasing WPH of the lithography exposure system 10.

In accordance with at least one embodiment, a method includes: depositing a mask layer over a substrate; directing radiation reflected from a collector of a lithography system toward the mask layer according to a pattern; blocking a portion of the radiation by a blocking structure, the blocking structure being attached to a reflector of the lithography system; forming openings in the mask layer by removing regions of the mask layer exposed to the radiation; and removing material of a layer underlying the mask layer exposed by the openings.

In accordance with at least one embodiment, a method includes: determining a second position of a reflector, the second position being associated with a first position of the collector, the first position being associated with contamination of the collector; positioning a blocking element over the second position of the reflector; and patterning a layer of a wafer by radiation from the collector that is reflected by unblocked portions of the reflector.

In accordance with at least one embodiment, a lithography system includes a wafer stage configured to support a wafer, projection optics configured to direct patterned radiation onto a region of the wafer, a mask stage configured to form and direct the patterned radiation to the projection optics, and a light source configured to emit unpatterned radiation to the mask stage. The light source includes a collector, a first position of the collector being associated with contamination, and illumination optics configured to direct the unpatterned radiation to the mask stage. The illumination optics include a reflector including at least two reflecting slits, a second position of the reflector being associated with the first position of the collector, and a blocking structure configured to block the second position of the reflector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

depositing a mask layer over a substrate;

directing radiation reflected from a collector of a lithography system toward the mask layer according to a pattern;

blocking a portion of the radiation by a blocking structure, the blocking structure being attached to a reflector of the lithography system;

forming openings in the mask layer by removing regions of the mask layer exposed to the radiation; and removing material of a layer underlying the mask layer exposed by the openings.

2. The method of claim 1, wherein the blocking a portion includes:

positioning a blocking element over a location of the reflector associated with contamination of the collector.

3. The method of claim 2, wherein the blocking a portion includes:

positioning a second blocking element over a second location of the reflector associated with contamination of the collector, the second blocking element being offset from the blocking element.

4. The method of claim 2, further comprising:

removing the blocking element following removing the contamination from the collector.

5. The method of claim 2, wherein the blocking element has shape similar to or larger than a segment of the reflector.

6. The method of claim 2, wherein the blocking structure includes a frame attached to the reflector, and the blocking element is attached to the frame.

7. The method of claim 1, wherein the reflector is a field facet mirror, and the radiation is extreme ultraviolet radiation.

8. A method, comprising:

depositing a mask layer over a substrate;

determining a second position of a reflector that corresponds to a first position of a collector having contaminant accumulation, wherein the reflector is a field facet mirror;

attaching a blocking element to a frame that is mounted on the reflector, the blocking element overlying the second position and blocking at least one reflecting slit of the reflector;

directing radiation reflected from the collector toward the mask layer according to a pattern, the blocking element blocking a portion of the radiation from the first position of the collector from reaching the mask layer, wherein the radiation is extreme ultraviolet radiation;

forming openings in the mask layer by removing regions of the mask layer exposed to the radiation; and removing material of a layer underlying the mask layer that is exposed by the openings.

9. The method of claim 8, wherein the determining includes determining, from a calculated image that correlates contaminant-induced non-uniform intensity on a reflector with contaminant buildup on a collector by analyzing an exposure pattern on a wafer to derive the calculated image.

10. The method of claim 8, wherein the reflector is most proximal to the collector along an optical path between the collector and a reticle.

11. The method of claim 8, wherein the blocking element overlaps exactly one reflecting slit of the reflector.

12. The method of claim 11, wherein the blocking element comprises tungsten having lower reflectivity than the reflecting slit.

13. The method of claim 11, wherein an upper surface of the blocking element is vertically separated from the reflecting slit by a distance less than a height of the reflecting slit.

14. The method of claim 8, wherein the frame includes two rails extending in a first direction and the blocking element is secured to both rails.

15. A method, comprising:

providing, in a lithography system, a reflector that includes a frame-mounted blocking structure having at least one blocking element positioned over a second position of the reflector associated with a contaminant-affected first position of a collector, wherein the reflector is a field facet mirror;

depositing a mask layer over a substrate;

directing extreme-ultraviolet radiation reflected from the collector towards the mask layer on the substrate according to a pattern, the blocking element reducing intensity variation caused by the contaminant by blocking a portion of the extreme-ultraviolet radiation;

developing the mask layer to create openings corresponding to the radiation pattern; and etching an underlying layer through the openings, thereby transferring the pattern to the substrate;

wherein the blocking element is removable from a frame after the contaminant is removed from the collector.

16. The method of claim 15, wherein a length of the blocking element in a direction parallel to reflecting slits of the reflector the same as or exceeds a length of the reflecting slit the blocking element covers.

17. The method of claim 15, wherein the frame includes rails aligned with lanes between columns of reflecting slits, the rails and lanes being free of reflective material.

18. The method of claim 15, wherein the frame has a substantially octagonal perimeter with protruding portions that mirrors a profile of the reflector.

19. The method of claim 15, wherein the blocking element is secured to the frame by a clip, a fastener, or an adhesive.

20. The method of claim 15, wherein the reflector includes a central column of reflecting slits, and the blocking element is positioned over a reflective slit in the central column.

* * * * *